(12) United States Patent
Miyazaki

(10) Patent No.: US 7,825,453 B2
(45) Date of Patent: Nov. 2, 2010

(54) SEMICONDUCTOR DEVICE AND METHOD FOR MANUFACTURING THE SAME

(75) Inventor: Shoichi Miyazaki, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/347,375

(22) Filed: Feb. 6, 2006

(65) Prior Publication Data

US 2006/0214211 A1 Sep. 28, 2006

(30) Foreign Application Priority Data

Mar. 24, 2005 (JP) ............................. 2005-086341

(51) Int. Cl.
*H01L 27/108* (2006.01)
(52) U.S. Cl. ............................. 257/314; 257/E29.129
(58) Field of Classification Search ......... 257/314–322, 257/E29.129
See application file for complete search history.

(56) References Cited

U.S. PATENT DOCUMENTS

| 6,667,211 | B2 * | 12/2003 | Watanabe | .................... 438/259 |
| 6,845,042 | B2 * | 1/2005 | Ichige et al. | ........... 365/185.17 |
| 6,979,860 | B2 | 12/2005 | Miwa | |
| 2003/0094635 | A1 * | 5/2003 | Yaegashi | .................... 257/250 |
| 2005/0018485 | A1 * | 1/2005 | Noguchi et al. | ........ 365/185.17 |

FOREIGN PATENT DOCUMENTS

| JP | 8-64788 | 3/1995 |
| JP | 11-74369 | 3/1999 |
| JP | 2003-51557 | 2/2003 |
| JP | 2004-356491 | 12/2004 |

OTHER PUBLICATIONS

Notification of Reasons for Rejection mailed by the Japanese Patent Office on Apr. 13, 2010, in counterpart Japanese Patent Appln No. 2005-086341.

* cited by examiner

*Primary Examiner*—Bradley K Smith
*Assistant Examiner*—Alexander Belousov
(74) *Attorney, Agent, or Firm*—Finnegan, Henderson, Farabow, Garrett & Dunner, L.L.P.

(57) ABSTRACT

A semiconductor device includes a memory cell gate structure having a first gate insulating film, a first gate electrode, a second gate insulating film, and a second gate electrode, a select gate structure having a third gate insulating film and a third gate electrode including a first electrode portion, a second electrode portion, and a third electrode portion between the first electrode portion and the second electrode portion, a first impurity diffusion layer formed in a surface area of the semiconductor substrate and located at a portion which corresponds to an area between the memory cell gate structure and the first electrode portion, and a second impurity diffusion layer formed in a surface area of the semiconductor substrate and located at a portion which corresponds to an area between the first electrode portion and second electrode portion.

10 Claims, 5 Drawing Sheets

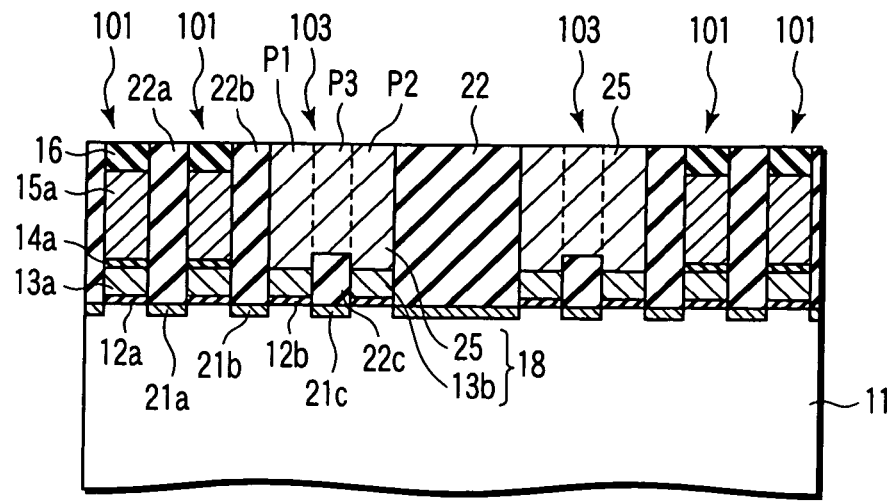
F I G. 6
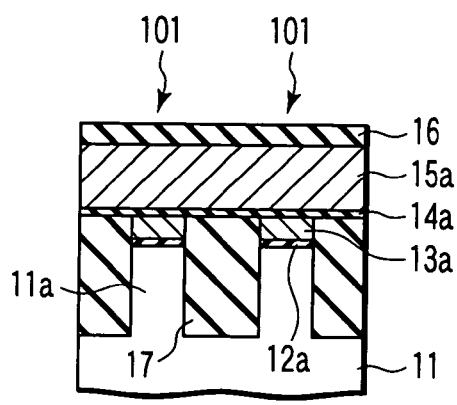
F I G. 7
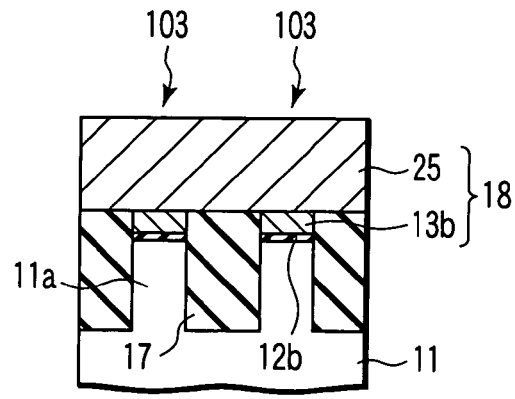
F I G. 8
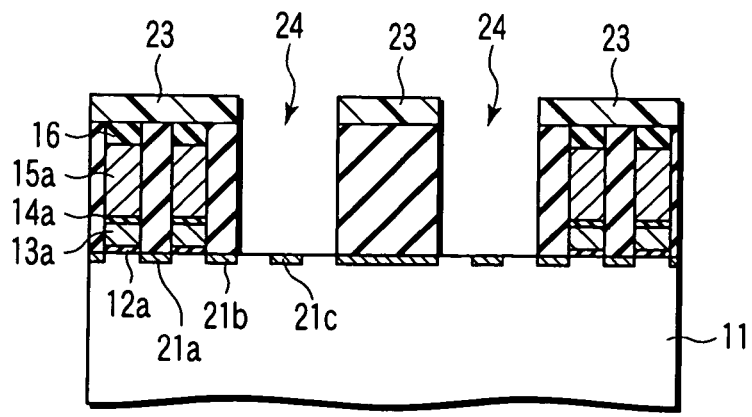
F I G. 9

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2005-086341, filed Mar. 24, 2005, the entire contents of which are incorporated herein by reference.

BACKGROUND OF THE INVENTION

1. Field of the Invention

The present invention relates to a semiconductor device and a method for manufacturing the semiconductor device.

2. Description of the Related Art

In recent years, NAND type flash memories have been commonly used as electrically erasable nonvolatile semiconductor storage devices. The NAND type flash memory includes a large number of NAND cell units. Each NAND cell unit is configured so that a plurality of memory cells connected together in series are provided between select transistors. A control gate line (word line) is connected to each memory cell. A select gate line is connected to each select transistor.

In the NAND type flash memory, each of the select gate lines is wider than each of the control gate lines. That is, the control gate lines are arranged at the same pitch, and the select gate lines are arranged at a pitch different from that of the control gate lines. Thus, the select gate lines disturb the periodicity of the line arrangement. As a result, a decrease in the size of the semiconductor device affects the resolution or margin in a lithography step. This makes it difficult to accurately form the patterns of select gate lines and control gate lines.

Jpn. Pat. Appln. KOKAI Publication No. 2003-51557 discloses a structure in which two select gate lines having the same line width as that of control gate lines are provided in place of one select gate line with a large line width. This structure enables the select gate lines to be arranged at the same pitch as that of the control gate lines.

However, in this proposal, the two select gate lines are connected together using only a conductive portion that contacts the top surfaces of both select gate lines. That is, the two select gate lines are separated from each other. Accordingly, in the areas of the two select gate lines other than those in which the connecting conductive portion is formed, separate control signals propagate through the two select gate lines. Thus, disadvantageously, operational timings for the two select transistors corresponding to the two select gate lines may deviate from each other. This may prevent high-speed operations.

Thus, problems with the conventional art are that it is difficult to accurately form patterns and that the operational timings for the two select transistors may deviate from each other to prevent appropriate desired operations.

BRIEF SUMMARY OF THE INVENTION

A semiconductor device according to a first aspect of the present invention includes a memory cell gate structure having a first gate insulating film formed on a semiconductor substrate, a first gate electrode formed on the first gate insulating film, a second gate insulating film formed on the first gate electrode, and a second gate electrode formed on the second gate insulating film; a select gate structure having a third gate insulating film formed on the semiconductor substrate and a third gate electrode formed on the third gate insulating film and including a first electrode portion, a second electrode portion, and a third electrode portion between the first electrode portion and the second electrode portion; a first impurity diffusion layer formed in a surface area of the semiconductor substrate and located at a portion which corresponds to an area between the memory cell gate structure and the first electrode portion of the select gate structure; and a second impurity diffusion layer formed in a surface area of the semiconductor substrate and located at a portion which corresponds to an area between the first electrode portion and second electrode portion of the select gate structure.

A method for manufacturing a semiconductor device according to a second aspect of the present invention includes forming a memory cell gate structure, a first dummy gate structure, and a second dummy gate structure each having a first gate insulating film formed on a semiconductor substrate, a first gate electrode film formed on the first gate insulating film, a second gate insulating film formed on the first gate electrode film, and a second gate electrode film formed on the second gate insulating film; forming a first impurity diffusion layer and a second impurity diffusion layer, the first impurity diffusion layer being formed in a surface area of the semiconductor substrate and being located at a portion which corresponds to an area between the memory cell gate structure and the first dummy gate structure, the second impurity diffusion layer being formed in a surface area of the semiconductor substrate and being located at a portion which corresponds to an area between the first dummy gate structure and the second dummy gate structure; removing at least the second gate electrode films and second gate insulating films of the first and second dummy gate structures to form a hole; and forming a conductive film in the hole to form a select gate structure.

BRIEF DESCRIPTION OF THE SEVERAL VIEWS OF THE DRAWING

FIG. 6 is a sectional view along a bit line direction schematically showing a part of the process of manufacturing the semiconductor device according to the first embodiment of the present invention;

FIG. 7 is a sectional view along a word line direction schematically showing the configuration of the semiconductor device according to the first embodiment of the present invention;

FIG. 8 is a sectional view along a word line direction schematically showing the configuration of the semiconductor device according to the first embodiment of the present invention;

FIG. 9 is a sectional view along a bit line direction schematically showing a part of a process of manufacturing the semiconductor device according to a second embodiment of the present invention;

DETAILED DESCRIPTION OF THE INVENTION

Embodiments of the present invention will be described below with reference to the drawings.

Embodiment 1

Figure 1:
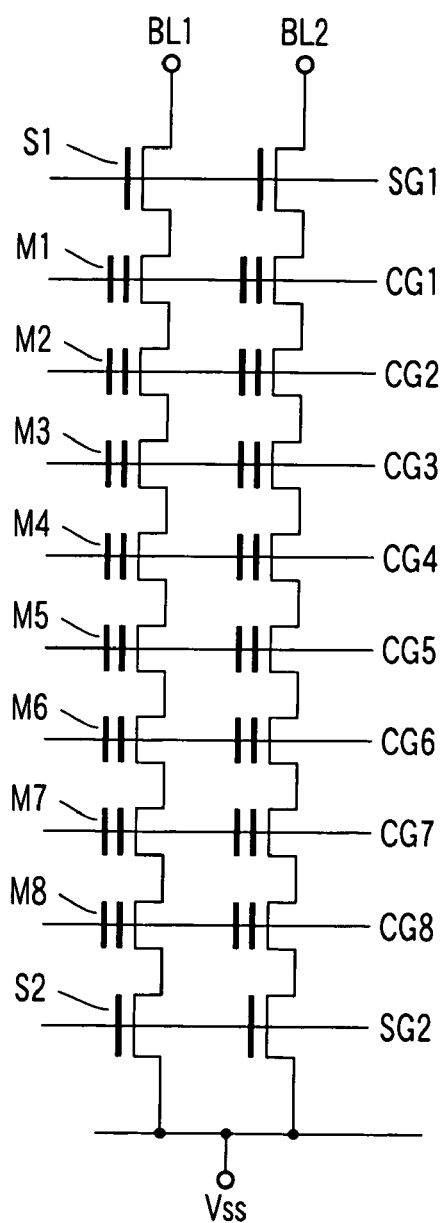
FIG. 1 is an equivalent circuit diagram showing the configuration of a semiconductor device according to a first embodiment of the present invention.
Figure 2:
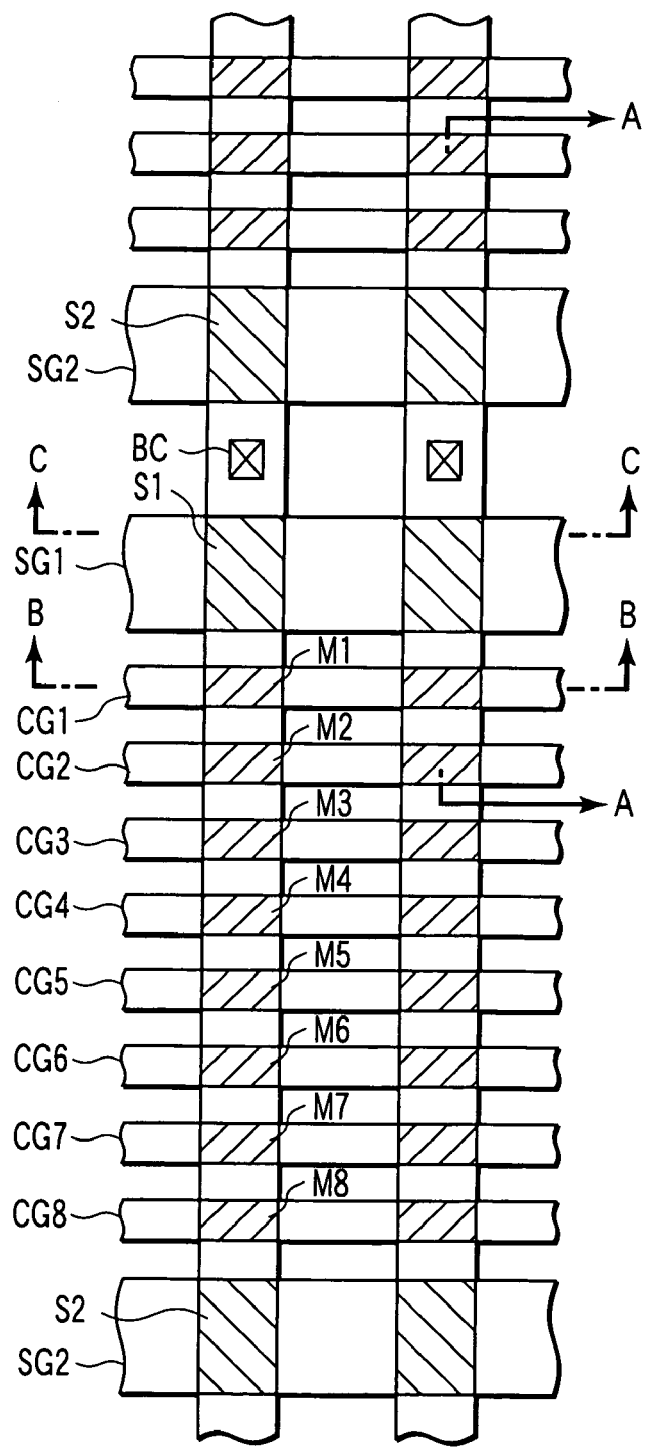
FIG. 2 is a plan view schematically showing the configuration of the semiconductor device according to the first embodiment of the present invention.

FIG. 1 is an equivalent circuit diagram showing the basic configuration of a semiconductor device (NAND type flash memory) according to a first embodiment of the present invention. FIG. 2 is a plan view schematically showing the configuration of the NAND type flash memory according to the present embodiment (however, bit lines are not shown).

As shown in FIGS. 1 and 2, each NAND cell unit is configured so that memory cells M1 to M8 connected together in series are provided between select transistors S1 and S2. The memory cells M1 to M8 and the select transistors S1 and S2 are formed in an element region. Adjacent element regions are separated from each other by an isolation region (isolation insulating film). Select gate lines SG1 and SG2 are connected to the select transistors S1 and S2, respectively. Control gate lines (word lines) CG1 to CG8 are connected to the memory cells M1 to M8, respectively. Bit lines BL1 and BL2 are each connected to each select transistor S1 via a bit line contact BC. A source line (not shown) is connected to select transistors S2.

As described later, the select transistors S1 and S2 are each formed substantially of two MIS transistors having a common gate electrode. Therefore, each of the select transistors S1 and S2 functions as one select transistor. Thus, on the drawings, these two MIS transistors are drawn as one select transistor. Further, each NAND cell unit is shown containing eight memory cells, but the number of memory cells is not limited to eight.

FIGS. 6 to 8 are sectional views schematically showing the configuration of the NAND flash memory according to the present embodiment. FIGS. 6, 7, and 8 correspond to a cross section taken along line A-A in FIG. 2 (along a bit line direction), a cross section taken along line B-B in FIG. 2 (along a word line direction), and a cross section taken along line C-C in FIG. 2 (along the word line direction).

A plurality of memory cell gate structure 101 are formed in association with the plurality of memory cells M1 to M8, shown in FIG. 2. A select gate structure 103 is formed in association with each of the select transistors S1 and S2. As shown in FIGS. 7 and 8, a silicon substrate (semiconductor substrate) 11 has an element region 11a separated by isolation trenches. A memory cell gate structure 101 and a select gate structure 103 are formed on the element region 11a. The isolation trenches are filled with an isolation insulating film 17.

As shown in FIGS. 6 and 7, each memory cell gate structure 101 is formed of a tunnel insulating film (first gate insulating film) 12a formed on the silicon substrate 11, a floating gate electrode (first gate electrode) 13a formed on the tunnel insulating film 12a, an inter-electrode insulating film (second gate insulating film) 14a formed on the floating gate electrode 13a, and a control gate electrode (second gate electrode) 15a formed on the inter-electrode insulating film 14a. Further, a stopper film 16 for CMP (Chemical Mechanical Polishing) is formed on the control gate electrode 15a.

As shown in FIGS. 6 and 8, the select gate structure 103 is formed of a gate insulating film (third gate insulating film) 12b formed on the silicon substrate 11 and a gate electrode (third gate electrode) 18 formed on the gate insulating film 12b. In the present embodiment, the gate insulating film 12b of the select gate structure 103 is formed during the same step as that in which the tunnel insulating film 12a of the memory cell gate structure 101 is formed. The gate insulating film 12b and the tunnel insulating film 12a use the same film thickness and the same material. Further, in the present embodiment, the gate electrode 18 of the select gate structure 103 is formed of a lower conductive film 13b and an upper conductive film 25. The lower conductive film 13b is formed during the same step as that in which the floating gate electrode 13a of the memory cell gate structure 101 is formed. The lower conductive film 13b is also formed of the same material as that of the floating gate electrode 13a. The upper conductive film 25 is formed after the formation of the memory cell gate structure 101.

In a direction parallel to a main surface of the silicon substrate 11, the gate electrode 18 is composed of a first electrode portion P1, a second electrode portion P2, and a third electrode portion P3 between the first electrode portion P1 and the second electrode portion P2. The gate insulating film 12b is formed between the electrode portion P1 and the silicon substrate 11 and between the electrode portion P2 and the silicon substrate 11. However, instead of the gate insulating film 12b, an insulating film (insulating portion 22c described later) different from the gate insulating film 12b is formed between the electrode portion P3 and the silicon substrate 11.

An insulating portion 22a is formed in an area between the adjacent memory cell structures 101. An insulating portion (first insulating portion) 22b is formed in an area between the memory cell gate structure 101 and the electrode portion P1 of the select gate structure 103. A top surface of the insulating portion 22b has the same height as that of a top surface of the gate electrode 18. The insulating portion 22c (second insulating portion) is formed in an area between the electrode portion P1 and electrode portion P2 of the select gate structure 103 and is located under the electrode portion P3. A top surface of the insulating portion 22c is lower than the top surfaces of the insulating portions 22a and 22b. In the present embodiment, the insulating portions 22a, 22b, and 22c are formed of an interlayer insulating film 22.

The electrode portions P1 and P2 and the memory gate structure 101 have an equal width (in the bit line direction).

Further, the insulating portions 22a, 22b, and 22c have an equal width (in the bit line direction). That is, the spacing between the adjacent memory cell gate structures 101, the spacing between the memory cell gate structure 101 and the electrode portion P1, and the spacing between the electrode portions P1 and P2 are equal. Accordingly, the memory cell gate structures 101 and the electrode portions P1 and P2 are arranged at the same pitch.

An impurity diffusion layer 21a for source and drain is formed in a surface area of the silicon substrate 11 under the insulating portion 22a. In other words, the impurity diffusion layer 21a is formed in a surface area of the silicon substrate 11 which area corresponds to the area between the adjacent memory cell gate structures 101. Further, an impurity diffusion layer 21b for source and drain (first impurity diffusion layer) is formed in a surface area of the silicon substrate 11 under the insulating portion 22b. In other words, the impurity diffusion layer 21b is formed in a surface area of the silicon substrate 11 which area corresponds to the area between the memory cell gate structure 101 and the electrode portion P1. Furthermore, an impurity diffusion layer 21c for source and drain (second impurity diffusion layer) is formed in a surface area of the silicon substrate 11 under the insulating portion 22c. In other words, the impurity diffusion layer 21c is formed in a surface area of the silicon substrate 11 which area corresponds to the area between the electrode portions P1 and P2.

When an on voltage is applied to the gate electrode 18 of the select gate structure 103, a channel is induced in an area located under the electrode portion P1. A channel is also induced in an area located under the electrode portion P2. These channels are coupled together via the impurity diffusion layer 21c. Thus, the application of the on voltage to the gate electrode 18 turns on the entire select transistor S1 (or entire select transistor S2) having the select gate structure 103. That is, the select transistor S1 (or select transistor S2) is formed substantially of two MIS transistors but share the gate electrode 18. Consequently, the select transistor S1 or S2 functions as one select transistor.

With reference to FIGS. 3 to 6, description will be given below of a method for manufacturing the NAND type flash memory according to the present embodiment. FIGS. 3 to 6 correspond to a cross section taken along line A-A in FIG. 2 (cross section taken in the bit line direction).

Figure 3:
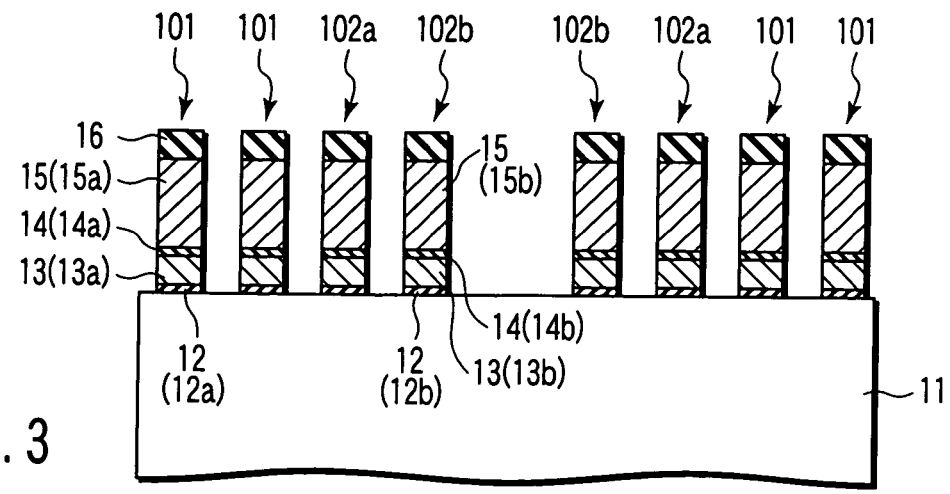
FIG. 3 is a sectional view along a bit line direction schematically showing a part of a process of manufacturing the semiconductor device according to the first embodiment of the present invention.

First, as shown in FIG. 3, a silicon oxide film of thickness 10 nm is formed by a thermal oxidation method on the surface of the p-type silicon substrate (semiconductor substrate) 11 as the tunnel insulating film (first gate insulating film) 12. Subsequently, a phosphorous-doped polycrystal silicon film of thickness 40 nm is deposited by an LPCVD (Low Pressure Chemical Vapor Deposition) method on the tunnel insulating film 12 as the floating gate electrode film (first gate electrode film) 13. Then, the floating gate electrode film 13, the tunnel insulating film 12, and the silicon substrate 11 are sequentially etched using a mask pattern (not shown) extended in the bit line direction as a mask. A plurality of element regions and a plurality of isolation trenches are thus formed. Moreover, the isolation trenches are filled with an isolation insulating film (isolation insulating film 17, shown in FIGS. 7 and 8) to form isolation regions.

Then, an ONO film of a silicon oxide film/silicon nitride film/silicon oxide film structure is formed by the LPCVD method as the inter-electrode insulating film (second gate insulating film) 14. Subsequently, a phosphorous-doped polycrystal silicon film of thickness 200 nm is deposited by the LPCVD method on the inter-electrode insulating film 14 as the control gate electrode film (second gate electrode film) 15. Moreover, a silicon nitride film is formed by the LPCVD method as a stopper film 16 for CMP.

Then, the stopper film 16, the control gate electrode film 15, the inter-electrode insulating film 14, the floating gate electrode film 13, and the tunnel insulating film 12 are sequentially etched by an RIE (Reactive Ion Etching) method using a resist pattern (not shown) extended in the word line direction as a mask. This forms a plurality of memory cell gate structures 101 each formed of the tunnel insulating film 12a, the floating gate electrode film 13a, the inter-electrode insulating film 14a, and the control gate electrode film 15a. At the same time, dummy gate structures 102a and 102b are formed which are each formed of the tunnel insulating film 12b, the floating gate electrode film 13b, the inter-electrode insulating film 14b, and the control gate electrode film 15b.

The mask resist pattern is formed so that the memory cell gate structure 101 and the dummy gate structures 102a and 102b have an equal width in the bit line direction. The mask resist pattern is formed so that the spacing between the adjacent memory cell gate structures 101, the spacing between the memory cell gate structure 101 and the dummy gate structure 102a, and the spacing between the dummy gate structures 102a and 102b are equal. As a result, the memory cell gate structures 101 and the dummy gate structures 102a and 102b are formed at the same pitch. This makes it possible to prevent a reduced resolution or margin in a lithography step executed in the formation of a resist pattern. It is thus possible to accurately form memory gate structures 101 and dummy gate structures 102a and 102b.

Figure 4:
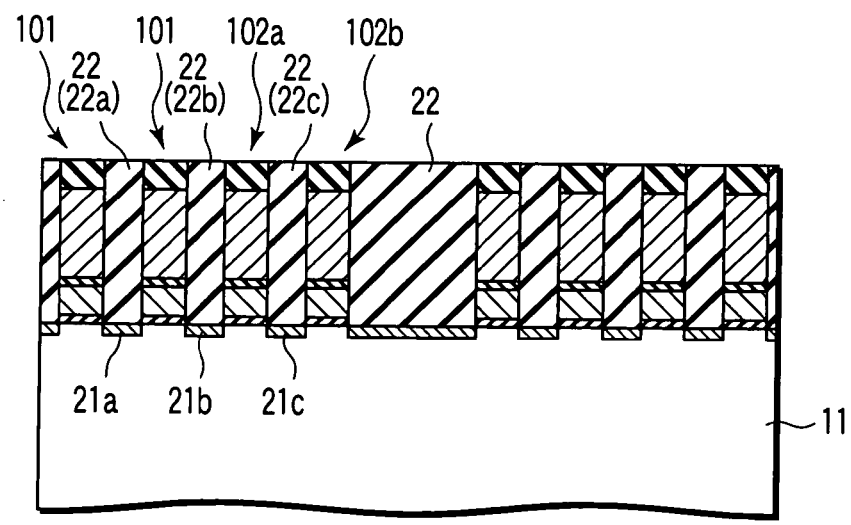
FIG. 4 is a sectional view along a bit line direction schematically showing a part of the process of manufacturing the semiconductor device according to the first embodiment of the present invention.

Then, as shown in FIG. 4, impurity diffusion layers 21a, 21b, and 21c for source and drain are formed using an ion implantation method. The impurity diffusion layer 21a is formed in the surface area of the silicon substrate 11 between the adjacent memory cell gate structures 101. The impurity diffusion layer 21b is formed in the surface area of the silicon substrate 11 between the memory cell gate structure 101 and the dummy gate structure 102a. The impurity diffusion layer 21c is formed in the surface area of the silicon substrate 11 between the dummy gate structures 102a and 102b.

Then, an inter-layer insulating film 22 is formed by the LPCVD method all over the surface of the resulting structure. Subsequently, the inter-layer insulating film 22 is polished by the CMP method using the stopper film 16 as a CMP stopper. The inter-layer insulating film 22 is thus flattened. As a result, the area between the adjacent memory cell gate structures 101 is filled with the insulating portion 22a. The area between the memory cell gate structure 101 and the dummy gate structure 102a is filled with the insulating portion 22b. The area between the dummy gate structures 102a and 102b is filled with the insulating portion 22c.

Figure 5:
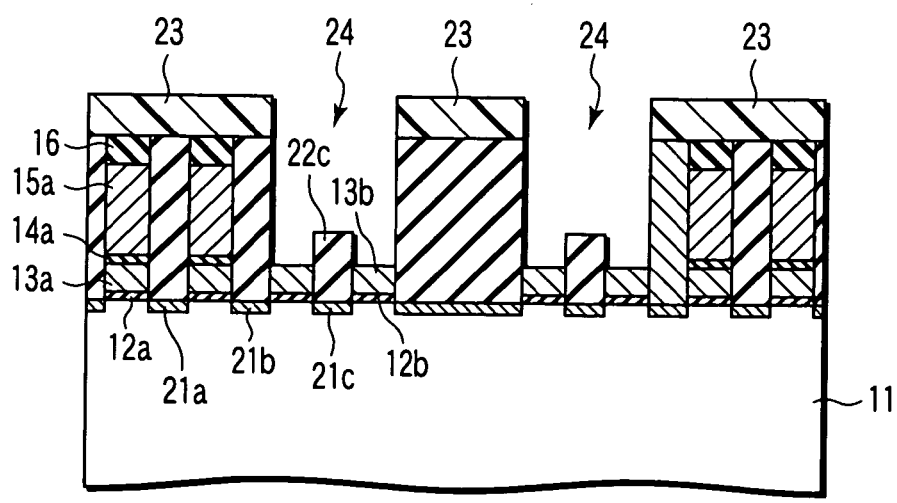
FIG. 5 is a sectional view along a bit line direction schematically showing a part of the process of manufacturing the semiconductor device according to the first embodiment of the present invention.

Then, as shown in FIG. 5, the resist pattern 23 is used as a mask to etch, by the RIE method, the stopper film 16, control gate electrode film 15, and inter-electrode insulating film 14 formed in the area corresponding to the dummy gate structures 102a and 102b. At the same time, the insulating portion 22c is also etched to have its height reduced. The floating gate electrode film 13 and the tunnel insulating film 12 are not etched but left as they are. Holes (or trenches) 24 are thus formed.

Then, as shown in FIG. 6, the resist pattern 23 is removed and then a phosphorous-doped polycrystal silicon film is deposited as a conductive film 25 by the LPCVD method all over the surface of the resulting structure. Subsequently, the CMP method is used to polish and flatten the conductive film 25. This results in a structure in which the holes 24 are filled with the conductive film 25. This forms gate electrodes 18 each composed of the floating gate electrode film 13b and conductive film 25 to obtain select gate structures 103.

As described above, according to the present embodiment, after the memory cell gate structures 101 and the dummy gate structures 102a and 102b have been formed, the electrode portions P1 and P2 are formed in the area corresponding to the dummy gate structures 102a and 102b. Further, the electrode portion P3 is formed between the electrode portions P1 and P2. Since the memory cell gate structures 101 and the dummy gate structures 102a and 102b are formed at the same pitch, it is possible to prevent a reduced resolution or margin in the lithography step. In the select gate structure 103, the presence of the electrode portion P3 between the electrode portions P1 and P2 makes the select gate structure 103 wider than the memory cell gate structure 101. Therefore, the present embodiment makes it possible to form a select gate structure 103 wider than the memory cell gate structure 101, while avoiding a decrease in resolution or margin in the lithography step.

Further, in the present embodiment, the electrode portions P1, P2, and P3 are integrated together to form the gate electrode 18 of the select gate structure 103. This enables a control signal to be simultaneously supplied to the electrode portions P1 and P2. It is thus possible to prevent operational timings for an MIS transistor corresponding to the electrode portion P1 from deviating from those for an MIS transistor corresponding to the electrode portion P2. As a result, appropriate desired operations are ensured.

Therefore, the present embodiment provides a NAND type flash memory which exhibits an excellent pattern accuracy and which can perform appropriate desired operations.

Further, in the present embodiment, the gate insulating film 12b of the select gate structure 103 is formed of the same material as that of the tunnel insulating film 12a of the memory cell gate structure 101 and during the same step in which the tunnel insulating film 12a is formed. This eliminates the need for the formation of a new gate insulating film for the select gate structure 103. It is thus possible to simplify the manufacturing process.

Embodiment 2

Figure 10:
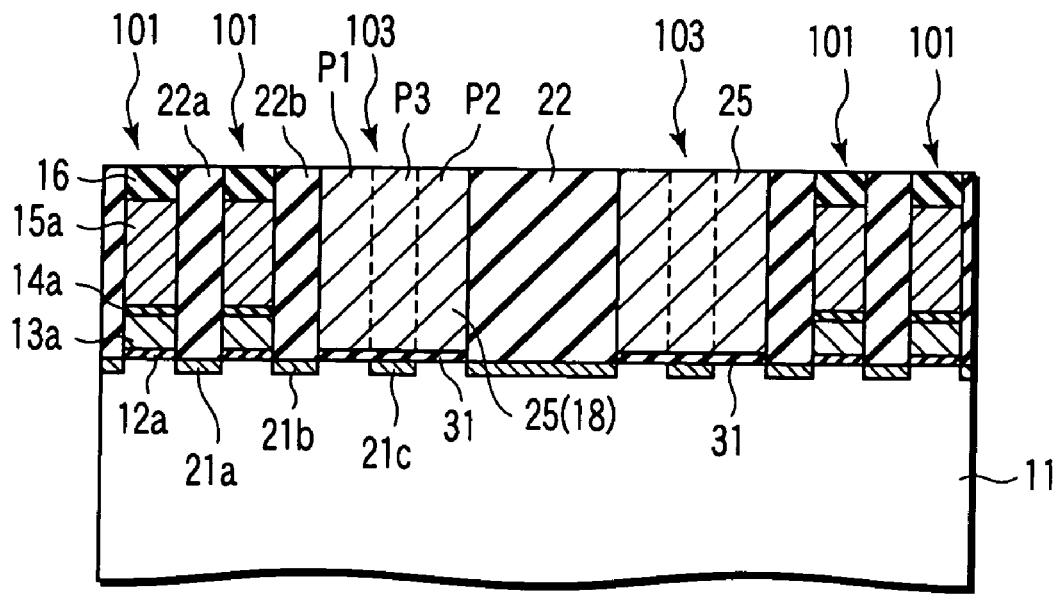
FIG. 10 is a sectional view along a bit line direction schematically showing a part of the process of manufacturing the semiconductor device according to the second embodiment of the present invention.

FIGS. 9 and 10 are sectional views schematically showing a method for manufacturing a semiconductor device (NAND type flash memory) according to a second embodiment of the present invention. An equivalent circuit diagram and plan view for the second embodiment are similar to FIGS. 1 and 2, shown in the first embodiment. Further, the basic configuration and manufacturing method according to the second embodiment are similar to those according to the first embodiment. The description of the matters described in the first embodiment is thus omitted.

First, such a structure as shown in FIG. 4 is formed by executing steps similar to those described in the first embodiment.

Then, as shown in FIG. 9, the resist pattern 23 is used as a mask to etch, by the RIE method, the stopper film 16, control gate electrode film 15, inter-electrode insulating film 14, floating gate electrode film 13, and tunnel insulating film 12 formed in the area corresponding to the dummy gate structures 102a and 102b (see FIG. 4). At this time, the entire insulating portion 22c (see FIG. 4) is etched. As a result, holes (or trenches) 24 are formed to expose the surface of the silicon substrate 11.

Then, as shown in FIG. 10, the resist pattern 23 is removed. A gate insulating film (third gate insulating film) 31 is newly formed on the exposed surface of the silicon substrate 11. The gate insulating film 31 may be formed by the thermal oxidation method or deposition method. Subsequently, a phosphorous-doped polycrystal silicon film is deposited by the LPCVD method all over the surface of the resulting structure as the conductive film 25. Moreover, the CMP method is used to polish and flatten the conductive film 25. This results in a structure in which the holes 24 are filled with the conductive film 25. As a result, gate electrodes 18 each composed of the conductive film 25 are formed on the gate insulating film 31 to obtain select gate structures 103. The gate insulating film 31 is formed on the exposed surface of the silicon substrate 11 and thus also interposed between the electrode portion P3 of the select gate structure 103 and the impurity diffusion layer 21c.

As described above, according to the present embodiment, the memory cell gate structures 101 and the select gate structures 103 are formed using a technique basically similar to that according to the first embodiment. The present embodiment can thus exert effects similar to those of the first embodiment. In the present embodiment, the new gate insulating film 31 is formed after the holes 24 have been formed to expose the surface of the silicon substrate 11. Thus, the gate insulating film 31 of the select gate structure 103 may be made different from the tunnel insulating film 12a of the memory cell gate structure 101 in at least one of the film thickness and the material. Therefore, it is possible to optimize each of the gate insulating film 31 of the select gate structure 103 and the tunnel insulating film 12a of the memory cell gate structure 101. A semiconductor device can thus be provided which has excellent characteristics and a high reliability.

Embodiment 3

Figure 11:
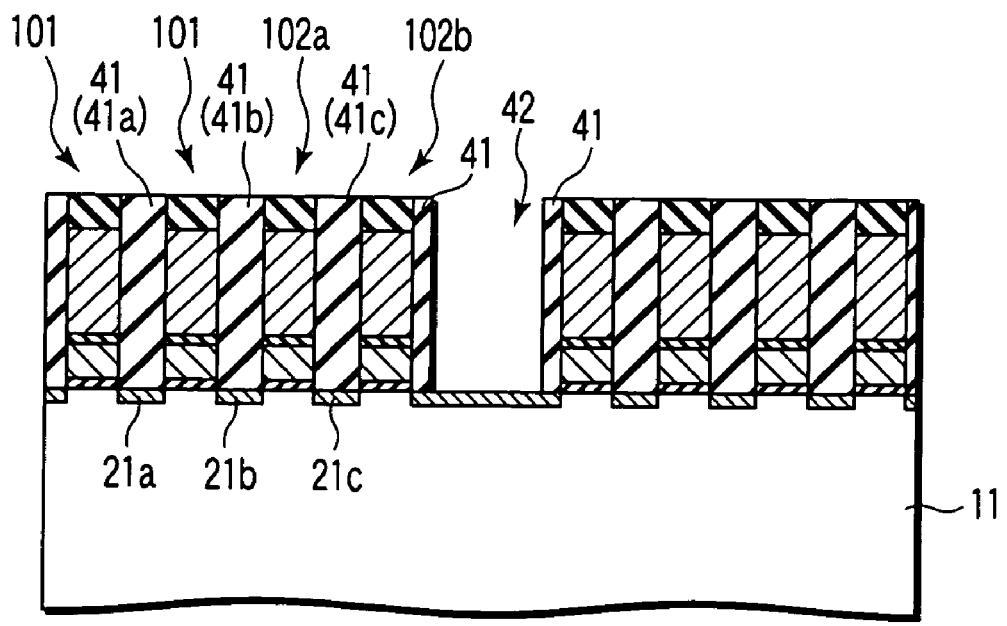
FIG. 11 is a sectional view along a bit line direction schematically showing a part of a process of manufacturing the semiconductor device according to a third embodiment of the present invention.
Figure 13:
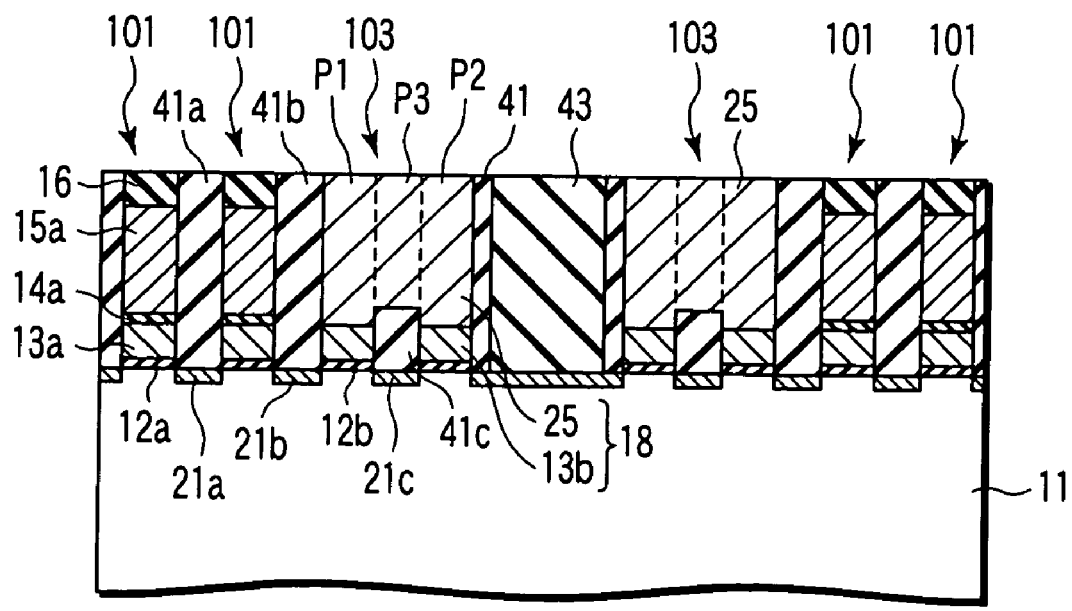
FIG. 13 is a sectional view along a bit line direction schematically showing a part of the process of manufacturing the semiconductor device according to the third embodiment of the present invention

FIGS. 11 and 13 are sectional views schematically showing a method for manufacturing a semiconductor device (NAND type flash memory) according to a third embodiment of the present invention. An equivalent circuit diagram and plan view for the third embodiment are similar to FIGS. 1 and 2, shown in the first embodiment. Further, the basic configuration and manufacturing method according to the third embodiment are similar to those according to the first embodiment. The description of the matters described in the first embodiment is thus omitted.

First, such a structure as shown in FIG. 3 is formed by executing steps similar to those described in the first embodiment.

Then, as shown in FIG. 11, impurity diffusion layers 21a, 21b, and 21c for source and drain are formed using an ion implantation method as in the case of the first embodiment. Subsequently, side wall insulating films 41 are formed by the LPCVD method in order to form side wall films for LDD on gate electrodes of MIS transistors in a control circuit (peripheral circuit; not shown). The side wall insulating films 41 are then etched back. Since a reduction in the size of a semiconductor device reduce the spacing between memory cells, the area between the adjacent memory cell gate structures 101 is completely filled with the side wall insulating film 41 (insulating portion 41a). Similarly, the area between the memory cell gate structure 101 and the dummy gate structure 102a is completely filled with the side wall insulating film 41 (insulating portion 41b). The area between the dummy gate structures 102a and 102b is completely filled with the side wall insulating film 41 (insulating portion 41c). However, a wide void 42 is not completely filled with the side wall insulating film 41; the void 42 is formed in the area between NAND cell units arranged adjacent to each other in the bit line direction (area in which a bit line contact is formed).

Figure 12:
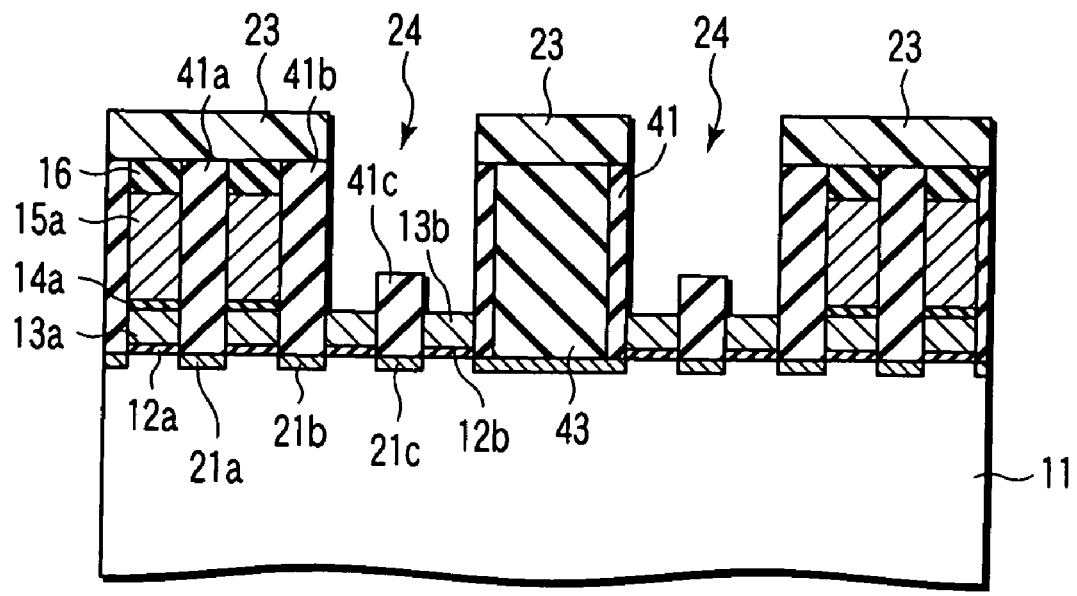
FIG. 12 is a sectional view along a bit line direction schematically showing a part of the process of manufacturing the semiconductor device according to the third embodiment of the present invention.

Then, as shown in FIG. 12, an inter-layer insulating film 43 is formed by the LPCVD method all over the surface of the resulting structure. Subsequently, the CMP method is used to polish and flatten the inter-layer insulating film 43, by using a stopper film 16 as a CMP stopper. As a result, the void 42 is filled with the inter-layer insulating film 43.

Then, as in the case of the first embodiment, the resist pattern 23 is used as a mask to etch, by the RIE method, the stopper film 16, control gate electrode film 15, and inter-electrode insulating film 14 formed in the area corresponding to the dummy gate structures 102a and 102b. At the same time, the insulating portion 41c is also etched to have its height reduced. The floating gate electrode film 13 and the tunnel insulating film 12 are not etched but left as they are. Holes (or trenches) 24 are thus formed.

Then, as shown in FIG. 13, the resist pattern 23 is removed and then the holes 24 are filled with the conductive film 25 as in the case of the first embodiment. This forms gate electrodes 18 each composed of the floating gate electrode film 13b and conductive film 25 to obtain select gate structures 103.

In this manner, according to the present embodiment, the memory cell gate structures 101 and the select gate structures 103 are formed using a technique similar to that according to the first embodiment. Therefore, the present embodiment can exert effects similar to those of the first embodiment.

In the present embodiment, when the holes 24 are formed in the step shown in FIG. 12, the tunnel insulating film 12b and the floating gate electrode film 13b are left as they are as in the case of the first embodiment. However, the tunnel insulating film 12b and the floating gate electrode film 13b may be removed as in the case of the first embodiment. In this case, after the holes 24 have been formed, it is possible to apply a method and structure similar to those according to the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
    a semiconductor substrate including an active area extending in a predetermined direction, the active area including a first upper surface;
    a plurality of memory cell transistors formed on the active area, each memory cell transistor including a memory cell gate structure having
        a first insulating film formed on the first upper surface of the active area,
        a first gate electrode formed on the first insulating film,
        a second insulating film formed on the first gate electrode, and
        a second gate electrode formed on the second insulating film, respectively;
    select gate transistors formed on the active area adjacent to the memory cell transistors in the predetermined direction, each of the select gate transistors including a select gate structure having
        a third insulating film formed on the first upper surface of the active area, and
        a third gate electrode formed on the third insulating film, the third gate electrode including
            a first and a second electrode portions formed in contact with the third insulating film, the first and second electrode portions being separated from each other in the predetermined direction,
            an insulator portion formed between the first and the second electrode portions, and
            a third electrode portion formed on the insulator portion and between the first and the second electrode portions to electrically connect the first and the second electrode portions;
    a first impurity diffusion layer formed in the first upper surface of the semiconductor substrate and located at a first portion which corresponds to an area between the memory cell gate structure and the first electrode portion of the select gate structure;
    a second impurity diffusion layer formed in the first upper surface of the semiconductor substrate and located at a second portion which corresponds to an area between the first and second electrode portions of the select gate structure;
    a trench formed, adjacent to the active area, on the first upper surface of the semiconductor substrate, the trench extending in the predetermined direction; and
    a fourth insulating film formed in the trench and extending in the predetermined direction, the fourth insulating film having an upper end portion which protrudes from the first upper surface of the semiconductor substrate,
    wherein the second insulating film is also formed on an upper surface of the fourth insulating film in the memory cell gate structure, the upper surface of the fourth insulating film being substantially covered by the second insulating film, and
    wherein a height of a second upper surface of the insulator portion is higher than a height of a third upper surface of the third insulating film relative to the first upper surface of the active area.

2. The semiconductor device according to claim 1, wherein the memory cell gate structure, the first electrode portion, and the second electrode portion are arranged at the same pitch.

3. The semiconductor device according to claim 1, wherein the first and second electrode portions have the same width as that of the memory cell gate structure.

4. The semiconductor device according to claim 1, wherein the first insulating film differs from the third insulating film in at least one of film thickness and material.

5. The semiconductor device according to claim 1, wherein the first and third insulating films use the same film thickness and the same material.

6. The semiconductor device according to claim 1, wherein the semiconductor device has a NAND type memory structure including the memory cell gate structure and the select gate structure.

7. The semiconductor device according to claim 1, wherein the first gate electrode includes a polycrystal silicon film.

8. The semiconductor device according to claim 1, wherein the second gate electrode includes a polycrystal silicon film.

9. The semiconductor device according to claim 1, wherein the first, the second and the third electrode portions include a polycrystal silicon film.

10. The semiconductor device according to claim 1, wherein the second insulating film includes a pair of silicon oxide films and a silicon nitride film located between the silicon oxide films.

* * * * *